US011035988B1

(12) United States Patent
Colburn et al.

(10) Patent No.: US 11,035,988 B1
(45) Date of Patent: *Jun. 15, 2021

(54) TUNABLE SHRINKAGE PROCESS FOR MANUFACTURING GRATINGS (71) Applicant: Facebook Technologies, LLC, Menlo Park, CA (US)

(72) Inventors: Matthew E. Colburn, Woodinville, WA (US); Giuseppe Calafiore, Redmond, WA (US); Matthieu Charles Raoul Leibovici, Seattle, WA (US); Maxwell Parsons, Seattle, WA (US); Austin Lane, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 287 days.

This patent is subject to a terminal disclaimer.

(21) Appl. No.: 16/108,262

(22) Filed: Aug. 22, 2018

Related U.S. Application Data (60) Provisional application No. 62/674,743, filed on May 22, 2018.

(51) Int. Cl.
G03F 7/00 (2006.01)
G02B 5/18 (2006.01)
G02B 27/01 (2006.01)

(52) U.S. Cl.
CPC ......... G02B 5/1857 (2013.01); G02B 5/1842 (2013.01); G02B 27/0172 (2013.01); G03F 7/001 (2013.01); G03F 7/0007 (2013.01); G02B 2027/0178 (2013.01)

(58) Field of Classification Search
CPC ........ G02B 5/18; G02B 27/01; G02B 5/1857; G02B 5/1847; G02B 5/1842; G02B 2027/0178; G03F 7/0007; G03F 7/001
See application file for complete search history.

(56) References Cited

U.S. PATENT DOCUMENTS

| 4,942,102 A * | 7/1990 | Keys | B32B 17/10036 430/1 |
|---|---|---|---|
| 5,201,960 A * | 4/1993 | Starov | H01L 21/67023 134/11 |
| 5,278,029 A * | 1/1994 | Shirai | G03F 7/265 216/62 |
| 5,483,365 A * | 1/1996 | Pu | G11B 7/0065 359/10 |
| 6,358,653 B1 * | 3/2002 | Turberfield | B82Y 20/00 430/1 |
| 6,379,869 B1 * | 4/2002 | Schroeder | G03F 7/405 430/313 |
| 10,895,671 B1 * | 1/2021 | Calafiore | G02B 5/1857 |
| 2007/0164487 A1 * | 7/2007 | Beck | B82Y 40/00 264/496 |
| 2009/0073373 A1 * | 3/2009 | Kitson | G02F 1/13378 349/187 |
| 2009/0224416 A1 * | 9/2009 | Laakkonen | G02B 5/1852 264/1.38 |
| 2010/0278484 A1 * | 11/2010 | Scheerlinck | G02B 6/34 385/37 |
| 2010/0310995 A1 * | 12/2010 | Chen | G03F 7/40 430/326 |
| 2011/0033664 A1 * | 2/2011 | Dicker | C09D 4/00 428/142 |
| 2011/0244187 A1 * | 10/2011 | Rinko | B29D 11/0074 428/156 |
| 2012/0113678 A1 * | 5/2012 | Cornelissen | G02B 6/0063 362/607 |
| 2014/0231776 A1 * | 8/2014 | Takahashi | B29C 59/022 257/40 |
| 2014/0255833 A1 * | 9/2014 | Yasuda | G03F 7/0392 430/18 |
| 2016/0254331 A1 * | 9/2016 | Wang | H01L 27/3246 257/40 |
| 2018/0052276 A1 * | 2/2018 | Klienman | G02B 6/0035 |
| 2018/0095201 A1 * | 4/2018 | Meili | G02B 6/124 |
| 2019/0235142 A1 * | 8/2019 | Meyer Timmerman Thijssen | G02B 5/1819 |

(Continued)

FOREIGN PATENT DOCUMENTS

| JP | 03-235331 | * 10/1991 | H01L 21/302 |
|---|---|---|---|
| JP | 05-251864 | * 9/1993 | H05K 3/46 |

(Continued)

OTHER PUBLICATIONS

Lin et al. "Inclined exposure and incomplete thermal reflow process for fabricating asymmetric microlens array", Proc DTIP 2012 (2012).*
Wu et al., "Characteristics of DuPont photopolymers for slanted holographic grating formations", JOSA B vol. 21(10) pp. 1722-1731 (Oct. 2004).*
Parness et al., "A microfabricated wedge-shaped adhesive array displaying gecko like dynamic adhesion, directionality and long lifetime", J R Soc. Interface vol. 6 pp. 1223-1232 (2009).*
Aksak et al., "Adhesion of biologically inspired vertical and angled polymers microfiber arrays" Langmuir vol. 23(6) pp. 3323-3332 (2007).*
Ventola et al. "High phase retardation by waveguiding in slanted photonic nanostructures", Opt. Expr., vol. 19(1) pp. 241-246 (Jan. 2011).*
Machine translation of WO 2018/126760 (2018).*
Machine translation of JP 05-251864 (1993).*

(Continued)

Primary Examiner — Martin J Angebranndt
(74) Attorney, Agent, or Firm — Fenwick & West LLP (57) ABSTRACT A manufacturing system performs a lithographic patterning of a resist formed on a substrate to create a first optical grating including a plurality of structures at a first slant angle relative to the substrate. The manufacturing system performs a tunable shrinkage of the plurality of structures to adjust the first slant angle to a target slant angle different from the first slant angle. In some embodiments, the manufacturing system performs a post-processing of the plurality of structures to create a second optical grating from the first optical grating. The post-processing may adjust at least one of: a refractive index, a height, and a volume of the first optical grating.

12 Claims, 7 Drawing Sheets (56) References Cited

U.S. PATENT DOCUMENTS

2019/0243237 A1* 8/2019 Watkins ................ C09D 11/52
2020/0033530 A1* 1/2020 Colburn ............. H01J 37/3171

FOREIGN PATENT DOCUMENTS

JP          11-074253     *  3/1999   ......... H01L 21/3065
WO       2018/126760    *  7/2018   ............... G02B 5/18

OTHER PUBLICATIONS

Machine translation of JP 11-074253 (1999).*
Jang et al., "3D micro and nanostructures via interferences lithography", Adv. Funct. Mater., vol. 17 pp. 3027-3041 (2007).*
Xu, "Fabrication of high fidelity, high index 3D photonic crystals using a templating approach", Thesis, Univ. Penn., 188 pages (Dec. 2009).*
Pang et al., "Fabrication of optical structures using SU-8 photoresist and chemically assisted ion beam etching" Opt. Eng., vol. 42(10) pp. 2912-2917 (Oct. 2003).*
Pinto et al., "Optimized SU-8 processing for low-cot microstructures fabrication without cleanroom facilities", Micromachines, vol. 5 pp. 738-755 (2014).*
Dong et al., "One-step fabrication of polymer components for microphotonics by gray scale electron beam lithography", J. Eur. Opt. Soc.-Rapid Publ. vol. 6 articles 11010 (Apr. 2011).*
Lee, Innovative SU-8 lithography techniques and their applications, Micromachines vol. 6 pp. 1-18 (Dec. 2014).*
Verhaar, "Pattern transfer on vertical cavity sidewalls using SU-8", Thesis Delft Univ. Technol., (Jan. 2009).*

* cited by examiner

TUNABLE SHRINKAGE PROCESS FOR MANUFACTURING GRATINGS

CROSS REFERENCE TO RELATED APPLICATIONS

This application claims the benefit of U.S. Provisional Application No. 62/674,743, filed May 22, 2018, which is incorporated by reference in its entirety.

BACKGROUND

The present disclosure generally relates to waveguide displays, and specifically to a method of increasing the slant angle of grating elements based on shrinkage of grating elements in waveguide displays.

Diffraction gratings (e.g., off-axis coupling grating) may include elements at a particular slant angle. However, conventional lithographic patterning techniques are not sufficient to form diffractive elements at a large enough slant angle for certain applications (e.g., near-eye displays). As an example, current lithographic patterning techniques are limited to forming diffractive elements at slant angles less than 45 degrees.

SUMMARY

A manufacturing system performs a lithographic patterning of a resist formed on a substrate to create a first optical grating including a plurality of structures at a first slant angle relative to the substrate. The manufacturing system performs a tunable shrinkage of the plurality of structures to adjust the first slant angle to a target slant angle different from the first slant angle. In some configurations, the target slant angle is in the range of 0 to 85 degrees. In some embodiments, the manufacturing system performs a post-processing of the plurality of structures to create a second optical grating from the first optical grating. The post-processing may adjust at least one of: a refractive index, a height, and a volume of the first optical grating.

In some embodiments, the manufacturing system performs the tunable shrinkage of the plurality of structures based on a chemical cross-linking reaction (e.g. a partial cross-linking reaction, an orthogonal cross-linking reaction) of the patterned resist. In some embodiments, the manufacturing system performs the tunable shrinkage of the plurality of structures based on a removal of a plurality of moieties from the patterned resist.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

A manufacturing system for a tunable shrinkage process includes a patterning system, a shrinking system, and a post-processing system. The tunable shrinkage process is a method of performing a structural change in a photo-sensitive material in a controlled fashion based on a physical or chemical removal of constituents. For example, the manufacturing system induces the structural change based on a chemical reaction of a photo-sensitive material forming a specific shape on a substrate using conventional lithography techniques such as photolithography, imprinting, micromolding, etc. In another example, the manufacturing system induces the structural change based on a physical removal of thermally activated functional groups in a photo-sensitive material. The manufacturing system induces the structural change resulting in a change in at least one of a thickness of the photo-sensitive material, a slant angle of a structure formed from the photo-sensitive material with respect to a top surface of a substrate underneath. The slant angle is an angle formed between an axis passing through the structure formed from the photo-sensitive material on the substrate and a line perpendicular to the substrate. The manufacturing system performs the structural change in the photo-sensitive material from an as-deposited pattern formed using lithographic techniques such as micromolding to an intermediate grating in a controlled fashion. For example, the manufacturing system performs a change in the thickness of the photo-sensitive material and/or a change in the angle of inclination of the as-deposited pattern with respect to the substrate underneath. Micromolding refers to a method of transferring a specific shape on a photo-sensitive material based on an application of a mechanical force from a mold or template held above the photo-sensitive material. The intermediate grating pattern is a grating pattern with an intermediate slant angle formed by the manufacturing system based on a change in the angle of inclination of the as-deposited pattern. The manufacturing system fabricates a final grating based on a tunable shrinkage of the intermediate grating pattern. The tunable shrinkage of the intermediate grating pattern is based on a change in the thickness of the intermediate grating pattern and/or a change in the angle of inclination of the intermediate grating pattern with respect to the substrate underneath performed in a controlled fashion. The final grating has a final slant angle larger than the intermediate slant angle, and the final slant angle is closer to a threshold value of slant angle that may be achieved using current lithographic patterning techniques. Conventional lithographic patterning techniques (e.g. imprint lithography) are used for forming diffractive elements with slant angles far less than 45 degrees. However, such diffractive elements with a slant morphology are difficult to fabricate in a high volume manufacturing environment with a high throughput.
}

In contrast, the manufacturing system disclosed herein can be used to fabricate diffractive elements with curved morphologies that are otherwise difficult to make molds for using conventional techniques. The intermediate grating is designed in a manner to achieve the final grating once shrinkage has occurred.

Figure 1:
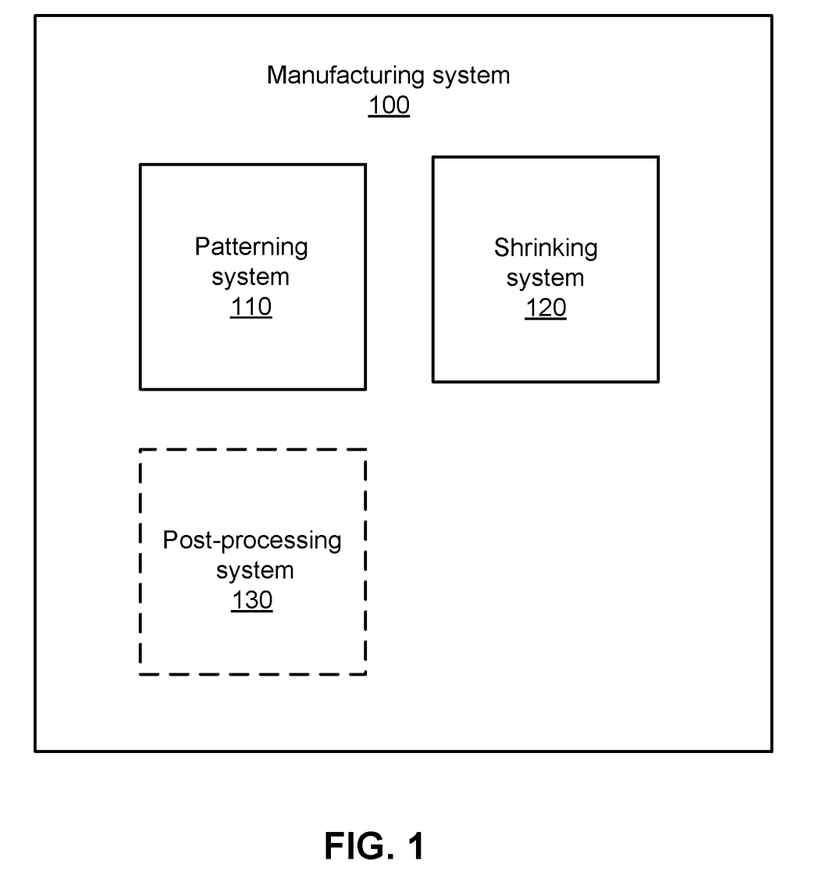
FIG. 1 is a block diagram of a manufacturing system, in accordance with one embodiment.

FIG. 1 is a block diagram of a manufacturing system 100, in accordance with one embodiment. The manufacturing system 100 is a set of systems that produces a grating with an adjustable index of refraction in a waveguide display. The manufacturing system 100 includes a patterning system 110, a shrinking system 120, a post-processing system 130, or some combination thereof. The manufacturing system 100 may be similar to a system of fabricating devices used to form an integrated circuit, and may include such components as an etching component, a thin film manufacturing component, an oxidation component, and so on. In some embodiments, the manufacturing system 100 includes a controller (not shown here) that controls each system in the manufacturing system 100.

The patterning system 110 is a system that performs a patterning of a substance formed on a substrate creating a change in geometry of the substance. The patterning system 110 performs a change in a slope of sidewalls of the substance formed on the substrate during the exposure and developing steps of any lithographic patterning technique to create a pre-processed grating. The pre-processed grating created by the patterning system 110 has a pre-processed slant angle associated with the slope of the sidewalls of the substance formed on the substrate. In some embodiments, the patterning system 110 includes a convection oven, a hot plate, a cool plate, an infrared lamp, a wafer spinner, a mask aligner, an exposure system, a wet bench based developer system, or some combination thereof. In one example, the patterning system 110 includes a pair of convection ovens for processing batches of wafers through hard and soft baking for dehydration purposes at a temperature in the range of 150-200° C., a programmable wafer spinner, a contact-type mask aligner, and an exposure system with a laser or mercury source of intensity close to 25 mW/cm². In some embodiments, the substrate is illuminated with no particular directionality of the light (isotropic illumination).

In some embodiments, as described below in detail with reference to FIG. 4, the patterning system 110 includes an adjustable exposure system with one or more actuators that adjust the position of an optical source (e.g. laser, mercury source) such that the substrate is illuminated with a collimated beam of light from any direction. In one example, the adjustable exposure system illuminates the substrate from one or more slant angles (e.g. 15 degrees) relative to an intermediate slant angle of an optical grating element. In another example, the exposure system illuminates from the backside of a transparent substrate with an isotropic or anisotropic optical source.

In alternate embodiments, the patterning system 110 includes an imprinting system that performs a mechanical stamping of a pattern on a substrate. In one example, the imprinting system performs a transfer of a pattern onto the substrate based on a removal of a residual polymeric layer and a subsequent removal of features imprinted into the patterned substrate. The patterning system 110 includes a thermal imprinting system, an ultraviolet imprinting system, a jet and flash imprinting system, a reverse imprinting system, or some combination thereof. The thermal imprinting system is a system that applies a mechanical force on a pre-heated stamp against a thermoplastic polymer that was previously spin-coated on the substrate. The ultraviolet imprinting system is a system that applies an ultraviolet radiation on a low-viscosity, UV-curable polymer (e.g. PDMS, HSQ) to cross-link the polymer followed by releasing the mold from the substrate. The jet and flash imprinting system is a system that dispenses the polymer on the substrate through one or more ink jets at a low pressure and temperature compared to the thermal imprinting system and the ultraviolet imprinting system. The reverse imprinting system is a system that coats a polymer directly onto a template and releases the patterned substrate by tuning the surface energies of the template and the substrate.

The shrinking system 120 is a system that induces shrinkage of the pre-processed grating formed by the patterning system 110 on the substrate to form an intermediate grating. The intermediate grating formed by the shrinking system 120 has an intermediate slant angle based in part on the slope of the sidewalls of the pre-processed grating formed on the substrate. In some configurations, the slope of the sidewalls of the pre-processed grating and the slope of the sidewalls of the intermediate grating may be similar. In alternate configurations, the slope of the sidewalls of the intermediate grating may be larger than the slope of the sidewalls of the pre-processed grating by a threshold value. The intermediate grating formed by the shrinking system 120 can be a one dimensional diffraction grating (i.e., diffracts light in one dimension) or a two dimensional diffraction grating (i.e., diffracts light in two dimensions). The intermediate grating formed by the shrinking system 120 can have a height of at most 2 microns, a duty cycle in the range of 0.1 to 0.9, a pitch in the range of 0.25 to 1.5 microns, and an intermediate slant angle in the range of 0 to 85 degrees. The shrinking system 120 may be a separate system or a part of the patterning system 110. The shrinking system 120 includes a cross-linking system, a thermal modification system, a distortion system, a design modification system, or some combination thereof. The cross-linking system is a group of devices that performs a cross-linking of the patterned substance initiated by heat, pressure, change in pH, light radiation, or some combination thereof. The thermal modification system is a group of devices that removes a plurality of moieties from a portion of a patterned substance based on an application of heat. In some configurations, the thermal modification system removes the plurality of moieties from a backbone of the polymer forming the patterned substance, one or more long chains of the polymer, or some combination thereof. In a different configuration, the shrinking system 120 induces a plurality of shrinking of the patterned substance formed on the substrate to form a plurality of intermediate gratings. For example, the shrinking system 120 induces a first shrinking along a first dimension (e.g. vertical dimension) with respect to the top surface of the substrate followed by a second shrinking along a second dimension (e.g. horizontal dimension) different than the first dimension with respect to the top surface of the substrate. Alternatively, the shrinking system 120 induces the first shrinking and the second shrinking at the same time.

In some configurations, the shrinking system 120 induces the shrinkage of a substance after the patterning system 110 performs the patterning of the substance. In a first embodiment, the shrinking system 120 induces the shrinkage of the substance based on a chemical cross-linking reaction of the patterned substance. The chemical cross-linking reaction includes at least one of: a partial cross-linking reaction, an orthogonal cross-linking reaction, or some combination thereof. The partial cross-linking reaction is based on a partial curing of resins by exposing the resins to sufficient amount of ultra-violet radiation to form a network that is less than the threshold amount of ultra-violet radiation to fully consume all the polymerizable functional groups (e.g. acrylates, methacrylates, epoxides, vinyl ethers, thiols in combination with alkene groups). The orthogonal cross-linking reaction is based on triggering resins using ultra-violet radiation or by heat using at least one of: orthogonal polymerization with photo/thermal catalyst, vapor-phase reaction between polymer network and bridging molecule (e.g. epoxide and diamine), dimerization reaction catalyzed by light, or some combination thereof. In one example, the shrinking system 120 induces the shrinkage based on a modification of a functional group (e.g. Aryl Azides, Diazirines) of a portion of the patterned substance using ultraviolet radiation. In a second embodiment, the shrinking system 120 induces the shrinkage by removing a plurality of moieties based on a thermal process. For example, the thermal modification system subjects the patterned substrate to a target temperature to remove a portion of the patterned substrate containing moieties (e.g. PPC, PPG) in the backbone of the substance. In another example, the shrinking system 120 induces the shrinking based on a sidewall removal process (e.g. tBOC deprotection of an acrylate, norbonyl, tBOC-Styrene, etc.)

In a different configuration, the shrinking system 120 induces the shrinkage of the patterned substance when the patterning system 110 performs the patterning of the substance. In one embodiment, the distortion system applies a mechanical force on a mold used to form the pattern on the substrate. In a second embodiment, the design modification system performs a change in the substance patterned on the substrate. For example, the design modification system of the shrinking system 120 changes the backbone of the polymer (e.g. HSQ) patterned on the substrate resulting in a desired change in the volume of the polymer.

The post-processing system 130 is a system that changes the refractive index of the patterned substance used as gratings in a waveguide display. In some embodiments, the post-processing system 130 is an optional system that changes the height of the intermediate grating formed by the shrinking system 120 to form a final grating. Additionally, the post-processing system 130 forms the final grating by performing a volumetric change on the intermediate grating based on a physical process, a chemical process, or some combination thereof. For example, the post-processing system forms the final grating by performing a 80% shrinking of an intermediate grating formed using imprint resins such as tetra-butoxy titanate.

In alternate embodiments, the post-processing system 130 may be a part of the shrinking system 120. In one example, the shrinking system 120 changes the slant angle of the intermediate grating from an intermediate slant angle of 60 degrees to a final slant angle of 75 degrees to directly form the final grating. In some configurations, the post-processing system 130 changes the refractive index of the final grating by adding functional materials with a high refractive index.

The manufacturing system 100 includes a controller (not shown) that generates process instructions to the post-processing system 130. Process instructions may be a set of slant angles corresponding to a set of refractive indices of the gratings fabricated by the manufacturing system 100. In one example, the process instruction includes an intermediate slant angle and a final slant angle of the gratings corresponding to an intermediate grating fabricated by the patterning system 110 and the final grating fabricated by the post-processing system 130.

Figure 2:
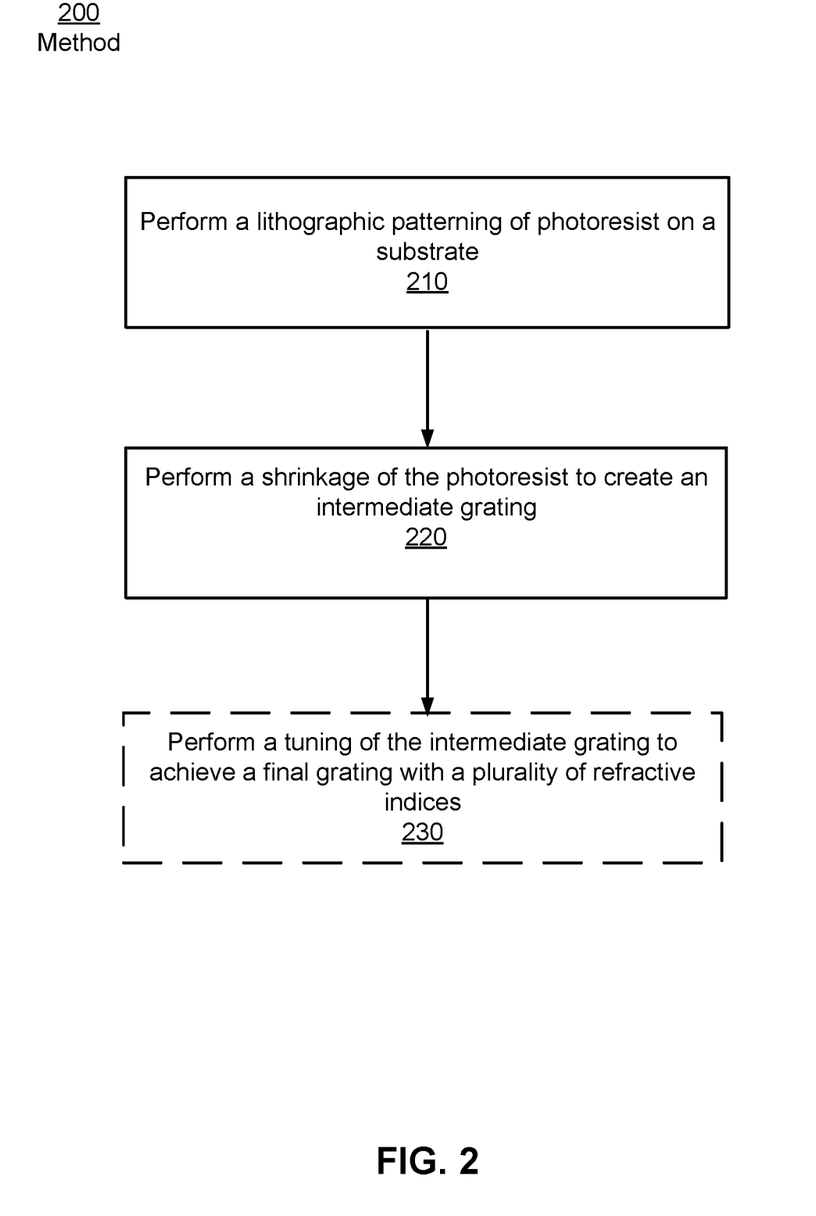
FIG. 2 is a flowchart illustrating the tunable shrinkage performed by the manufacturing system of FIG. 1, in accordance with one embodiment.

FIG. 2 is a flowchart illustrating the tunable shrinkage performed by the manufacturing system of FIG. 1, in accordance with one embodiment. The manufacturing system 100 includes a patterning system 110, a shrinking system 120, a post-processing system 130, or some combination thereof, as described above in conjunction with FIG. 1.

The patterning system 110 performs 210 a lithographic patterning of photoresist on a substrate. In some embodiments, the patterning of photoresist forms a pre-processed grating including a plurality of grating elements. The slant angle of the plurality of grating elements may be such that after shrinkage (see step 220) a final slant angle is achieved that is beyond that of the patterning system 110. In one example, the imprinting system performs 210 a mechanical stamping of a pattern on the substrate to create the pre-processed grating. The imprinting system performs 210 a transfer of a pattern onto the substrate based on a removal of a residual polymeric layer and a subsequent removal of features imprinted into the patterned substrate. In one example, the pattern is used for forming diffractive elements with a parallelogram shape. In alternate embodiments, the patterning system 110 performs 210 the lithographic patterning using a convection oven for dehydration of the substrate at 150-200° C., a wafer spinner for coating the substance on the substrate, a mask aligner for defining the lithographic pattern on the substrate, and an exposure system for transferring the lithographic pattern in the mask to the substrate.

The shrinking system 120 performs 220 a shrinkage of the photoresist to create an intermediate grating. The shrinking system 120 performs 220 a shrinkage of the pre-processed grating to create the intermediate grating. In some embodiments, the shrinking system 120 performs 220 the shrinkage when the patterning system 110 performs 210 the patterning of the photoresist to create an intermediate grating of the photoresist with a first intermediate slant angle. Alternatively, the shrinking system 120 performs 220 the shrinkage of the photoresist after the patterning system 110 performs 210 the patterning of the photoresist to create an intermediate grating of the photoresist with a second intermediate slant angle. For example, the shrinking system 120 performs 220 shrinkage of the pre-processed grating created by the patterning system 110 based on a physical or chemical removal of a portion of the pre-processed grating to create the intermediate grating with a second intermediate slant angle.

The post-processing system 130 optionally performs 230 a tuning of the intermediate grating to achieve a final grating with a plurality of refractive indices. In some embodiments, the post-processing system 130 performs 230 an adjustment of the refractive index of the intermediate grating to achieve a final grating with a final slant angle.

Figure 3:
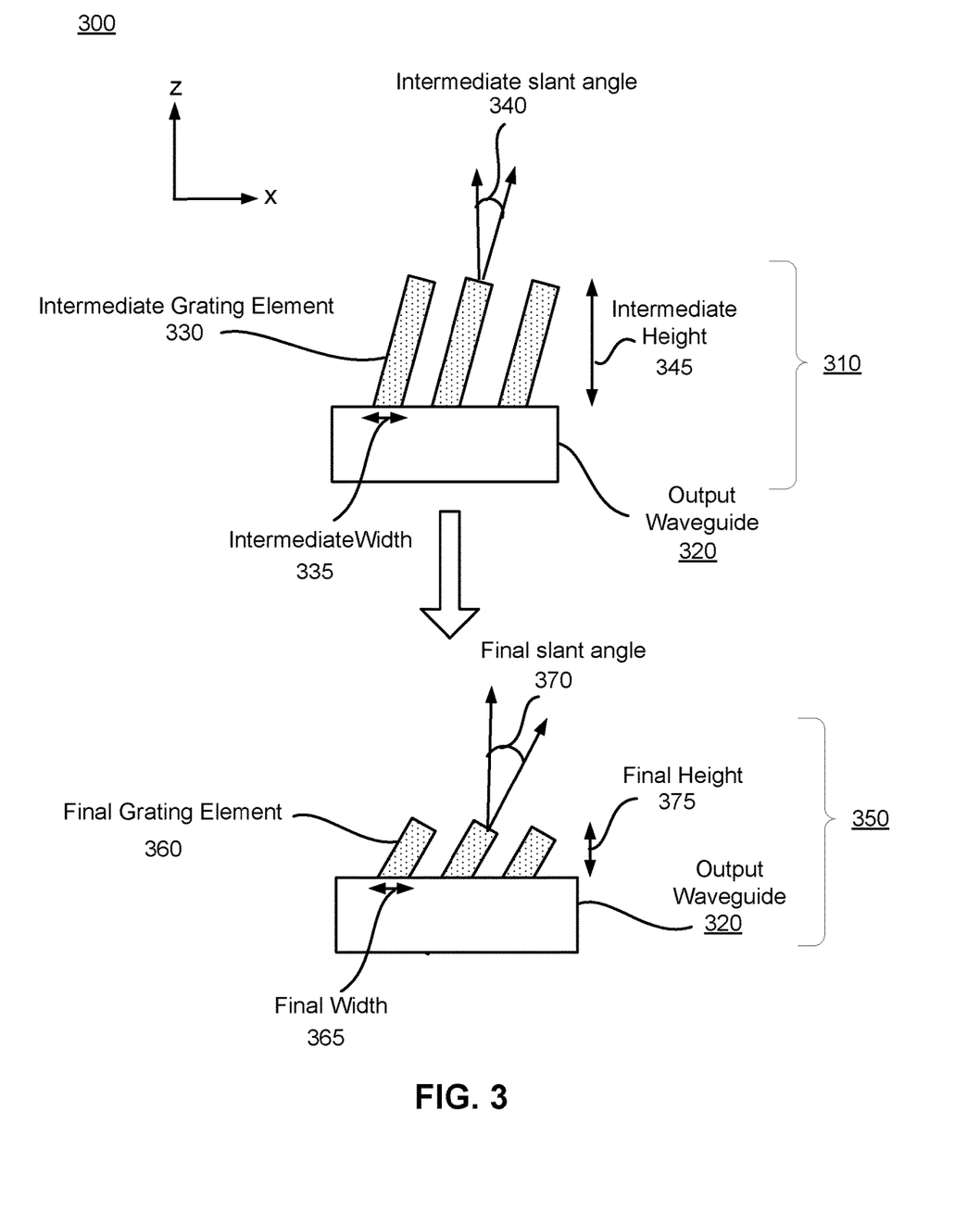
FIG. 3 is an illustration of a tunable shrinkage performed by the manufacturing system, in accordance with one embodiment.

FIG. 3 is an illustration 300 of a tunable shrinkage performed by the manufacturing system, in accordance with one embodiment. In the example of FIG. 3, the manufacturing system 100 performs 310 a lithographic patterning of a photoresist on an output waveguide 320. The output waveguide 320 is an optical waveguide that outputs image light to an eye of a user, as described below in detail in conjunction with FIG. 5. An intermediate grating element 330 is an optical grating element that couples the image light into a waveguide display, as described in detail below in conjunction with FIG. 5. The intermediate grating element 330 may be, e.g., a diffraction grating, a holographic grating, some other element that couples an image light into the output waveguide 320, or some combination thereof. In some configurations, the intermediate grating element 330 is composed of an organic material such as an imprint resist, a shield resist, etc. The intermediate grating element 330 is associated with an intermediate width 335 along the X-dimension, a set of intermediate slant angles 340, and an intermediate height 345 along the Z-dimension.

The manufacturing system 100 performs 350 a tunable shrinkage of the intermediate grating element 330 to form a final grating element 360. The final grating element 330 is associated with a final width 365 along the X-dimension, a final angle 370, and a final height 375 along the Z-dimension. The final slant angle 370 is larger than the slant angle of a final grating element formed by conventional manufacturing systems for lithographic patterning.

In some embodiments, the manufacturing system 100 includes a controller (not shown) that communicates the process instructions to the shrinking system 120 and the post-processing system 130. Process instructions may include a set of intermediate slant angles 340. The final grating element 360 is associated with a final slant angle 370 based on the set of intermediate slant angles 340.

Figure 4A:
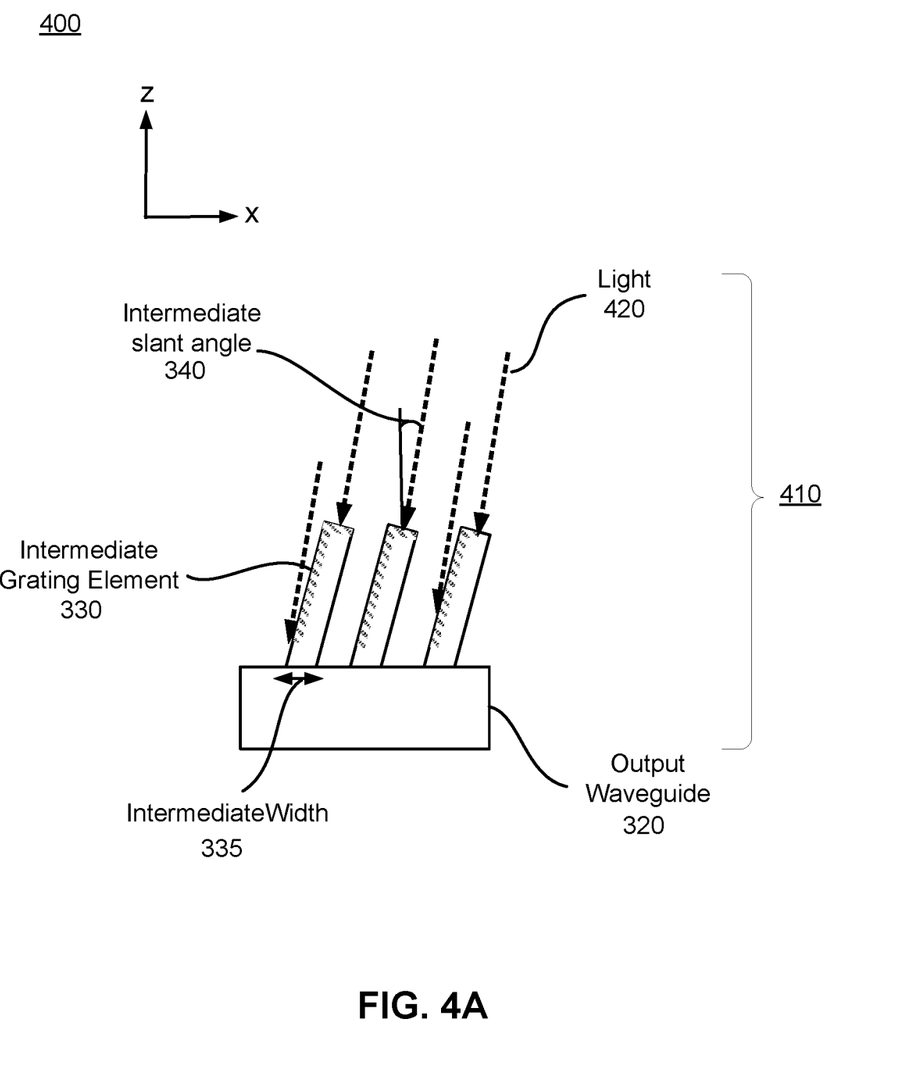
FIG. 4A is an illustration of a tunable shrinkage performed by the manufacturing system with an adjustable exposure system, in accordance with one embodiment.

FIG. 4A is an illustration 400 of a tunable shrinkage performed by the manufacturing system with an adjustable exposure system, in accordance with one embodiment. In the example of FIG. 4A, the manufacturing system 100 performs 410 a tunable shrinkage of the intermediate grating element 330 formed on an output waveguide 320 using an adjustable exposure system (not shown here). Referring back to FIG. 1, the adjustable exposure system is an optical sub-system of the patterning system 110. The adjustable exposure system includes an optical source (e.g. a laser, a mercury arc lamp) and a collimation lens assembly. The adjustable exposure system emits a collimated beam of light along any arbitrary direction with an adjustable intensity of illumination. In some configurations, the adjustable exposure system includes one or more actuators that adjust the position of the optical source and/or the collimation lens assembly. The adjustable exposure system illuminates the output waveguide 320 with the collimated beam of light from any direction at a target distance of separation in between the adjustable exposure system and the output waveguide 320.

As shown in the example of FIG. 4A, the adjustable exposure system emits light 420 toward the intermediate grating element 330. The light 420 is a collimated beam of light. In this embodiment, the light 420 is associated with a directionality along the X-Z plane. In other embodiments, it may have some other directionality. The directionality of the light 420 with reference to the intermediate slant angle 340 determines a location and depth of a portion of the intermediate grating element 330 that undergoes a surface reaction triggered by the light 420. In the example of FIG. 4A, a portion of the intermediate grating element 330 receives the light 420 along a specific direction, and the resulting reaction causes each intermediate grating element to bend in a first direction to form a modified grating element that is shown below in FIG. 4B.

In some embodiments, the distance of separation between the adjustable exposure system and the intermediate grating element 330 is adjusted to vary the speed of the surface reaction triggered by the light 420. In one example, the adjustable exposure system may be moved relatively closer (e.g. at most two millimeters) to the intermediate grating element 330 to increase the speed of the surface reaction triggered by the light 420 and create a first modified grating element associated with a first volume (e.g. 500 cubic nanometer). In another example, the adjustable exposure system may be moved relatively farther (e.g. fifty millimeters) from the intermediate grating element 330 to decrease the speed of the surface reaction triggered by the light 420 and create a second modified grating element associated with a second volume (e.g. 5 cubic nanometer).

Note that the example of FIG. 4A shows the light 420 directly interacting with the intermediate grating element 330. In alternate configurations, the adjustable exposure system may be located below the output waveguide 320. For example, the output waveguide 320 may directly receive the light 420 and the output waveguide 320 (e.g. a transparent substrate) may transmit a portion of the received light 420 toward the intermediate grating element 330.

Figure 4B:
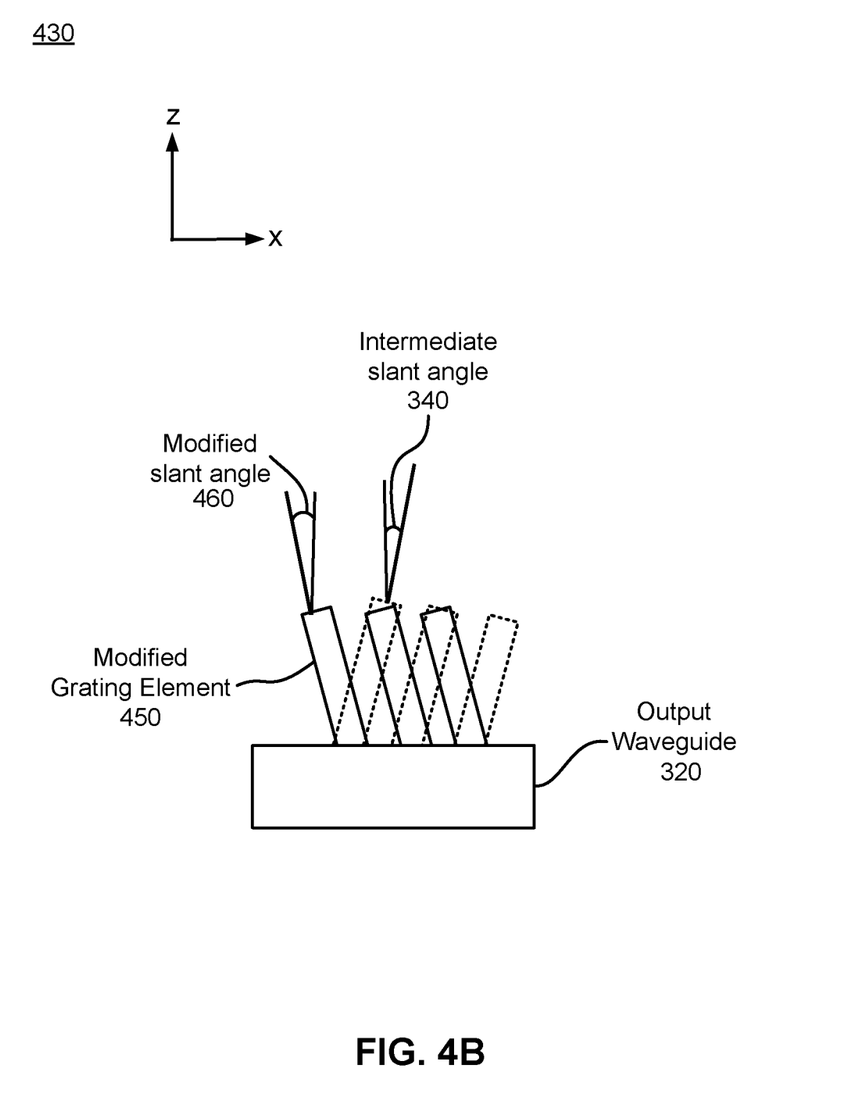
FIG. 4B is an illustration of a plurality of modified grating elements manufactured using the adjustable exposure system of FIG. 4A, in accordance with one embodiment.

FIG. 4B is an illustration 430 of a plurality of modified grating elements manufactured using the adjustable exposure system of FIG. 4A, in accordance with one embodiment. A location and orientation of the adjustable exposure system with reference to the intermediate grating element 330 affects the amount of bending of the intermediate grating element 330. In some configurations, the amount of bending depends, among several other parameters, a surface area of a portion of the intermediate grating element 330 that undergoes surface reaction due to illumination with a collimated beam of light, as described above with reference to FIG. 4A. For example, when the surface reaction occurs only around the tips of the intermediate grating element 330, an upward pull force acts on a substantially smaller surface area of the intermediate grating element 330, and accordingly, the amount of bending of the intermediate grating element 330 is substantially smaller. In contrast, when the surface reaction occurs along one or more sidewalls along with the tips of the intermediate grating element 330, the upward pull force acts on a substantially larger surface area, and accordingly, the amount of bending of the intermediate grating element 330 is substantially larger.

As shown in FIG. 4B, the intermediate grating element 330 has undergone a bending in an anti-clock-wise manner to form a plurality of modified grating elements that include the modified grating element 450. The plurality of modified grating elements are associated with a modified slant angle 460 relative to the output waveguide 320. In one example, the modified slant angle 460 is negative 30 degrees and the intermediate slant angle is 15 degrees. In an alternate configuration, when the adjustable exposure system illuminates the output waveguide 320 (e.g. a transparent substrate) from underneath, the intermediate grating element 330 receives a downward pull force and undergoes a bending in a clock-wise manner to form a plurality of modified grating elements. In one example, the modified slant angle 460 is positive 60 degrees and the intermediate slant angle 340 is 15 degrees.

In some configurations, the modified grating element 450 is the intermediate grating element 330 bent to a new location and/or surface orientation relative to the output waveguide 320. In alternate configurations, the modified grating element 450 is an additional layer formed above the intermediate grating element 330. In some embodiments, the modified grating element 450 has a first range of refractive indices and the intermediate grating element 330 has a second range of refractive indices. In alternate embodiments, the modified grating element 450 has a first range of RMS values of surface roughness and the intermediate grating element 330 has a second range of RMS values of surface roughness.

Figure 5:
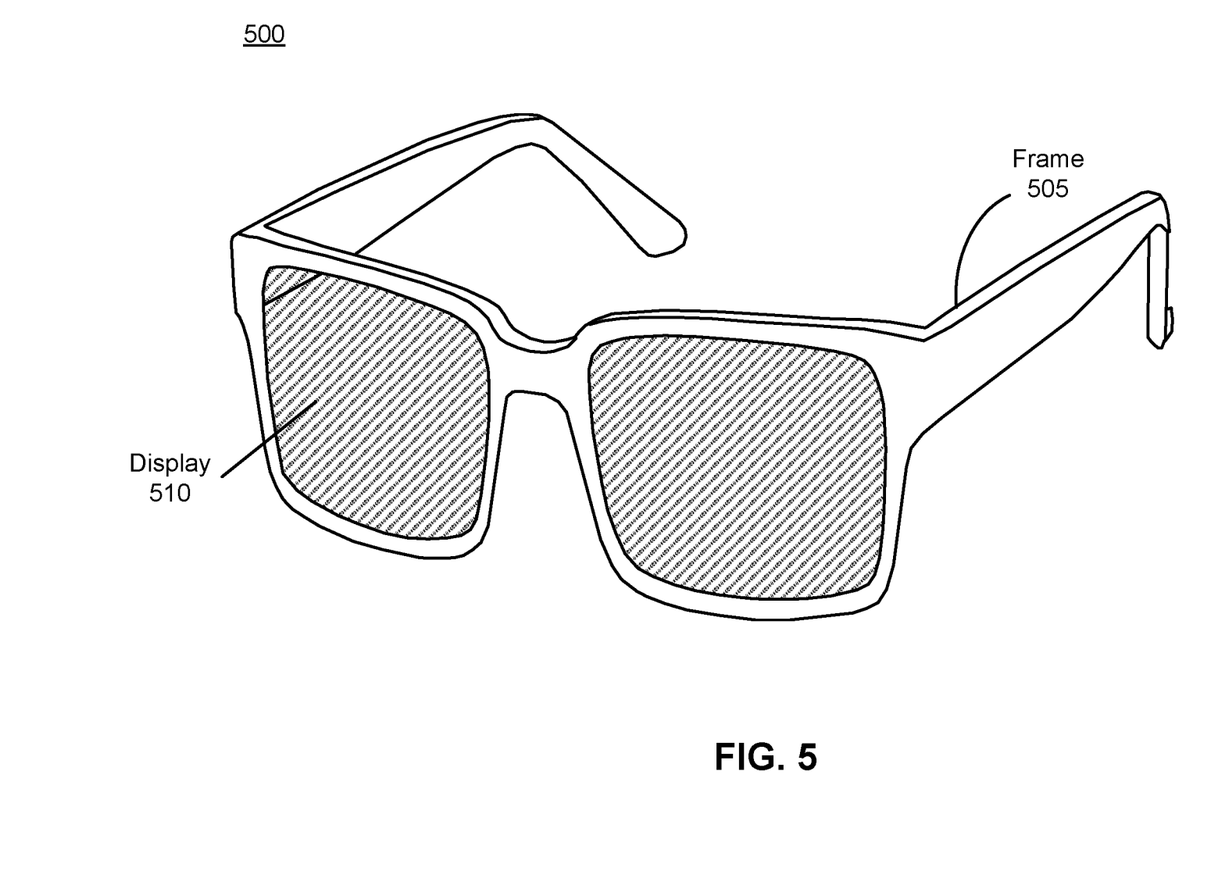
FIG. 5 is a diagram of a near-eye-display (NED) fabricated using the manufacturing system, in accordance with an embodiment.

FIG. 5 is a diagram of a near-eye-display (NED) 500 fabricated using the manufacturing system 100, in accordance with an embodiment. The NED 500 (also referred to as a head-mounted display) presents media to a user. Examples of media presented by the NED 500 include one or more images, video, audio, or some combination thereof. In some embodiments, audio is presented via an external device (e.g., speakers and/or headphones) that receives audio information from the NED 500, a console (not shown), or both, and presents audio data based on the audio information. The NED 500 is generally configured to operate as a VR NED. However, in some embodiments, the NED 500 may be modified to also operate as an augmented reality (AR) NED, a mixed reality (MR) NED, or some combination thereof. For example, in some embodiments, the NED 500 may augment views of a physical, real-world environment with computer-generated elements (e.g., images, video, sound, etc.).

The NED 500 shown in FIG. 5 includes a frame 505 and a display 510. The frame 505 includes one or more optical elements which together display media to users. The display 510 is configured for users to see the content presented by the NED 500. As discussed below in conjunction with FIG. 6, the display 510 includes at least one source assembly to generate an image light to present media to an eye of the user. The source assembly includes, e.g., a source, an optics system, or some combination thereof.

Figure 6:
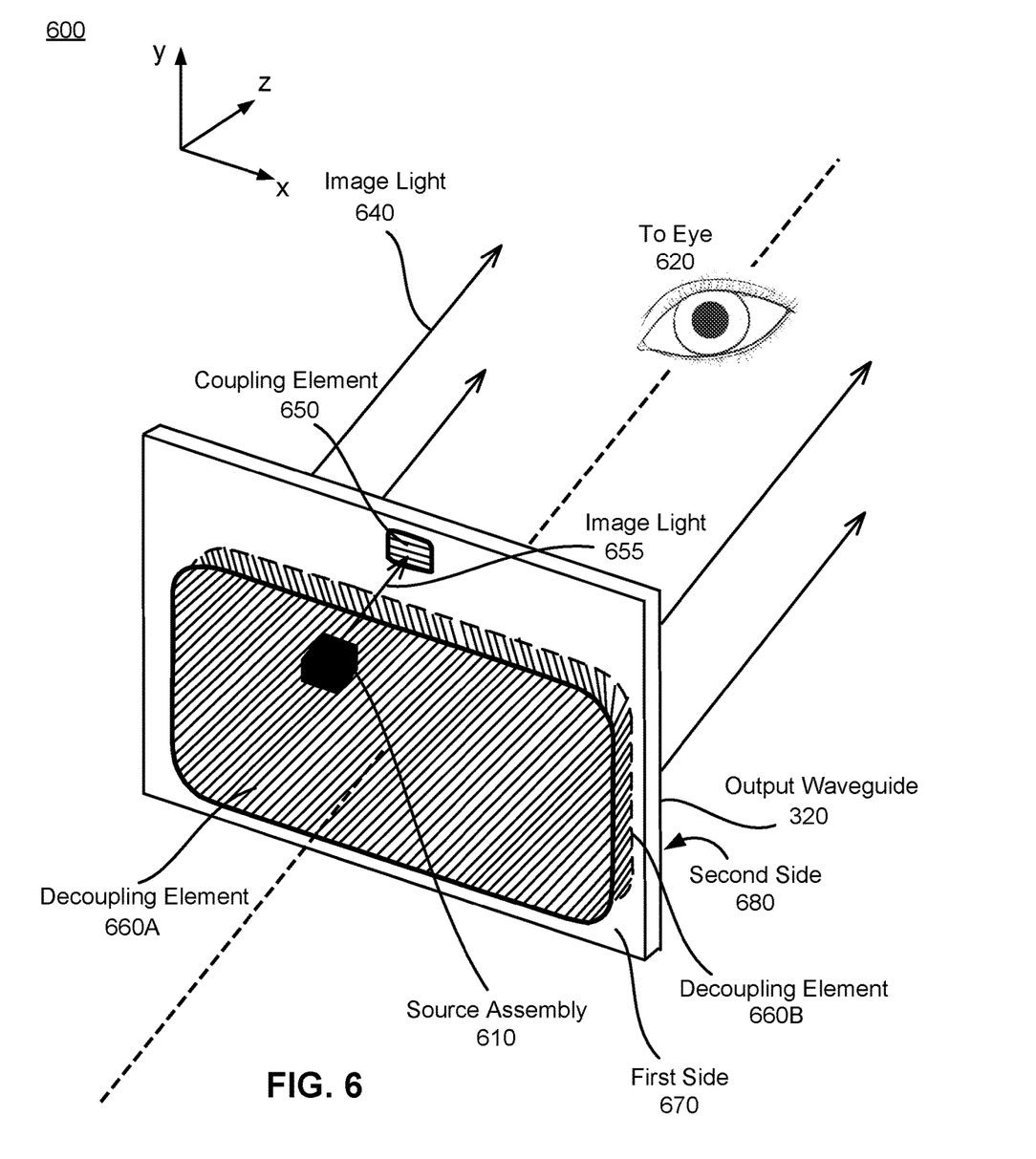
FIG. 6 illustrates an isometric view of a waveguide display fabricated using the manufacturing system, in accordance with an embodiment.

FIG. 6 illustrates an isometric view of a waveguide display 600, in accordance with an embodiment. In some embodiments, the waveguide display 600 (may also be referred to as a scanning waveguide display) is a component of the NED 500. In alternate embodiments, the waveguide display 600 is part of some other NED, or other system that directs display image light to a particular location.

The waveguide display 600 includes the output waveguide 320 and a source assembly 610. The source assembly 610 generates image light. The source assembly 610 includes a source array and an optics system (not shown here). The source assembly 610 generates and outputs an image light 655 to a coupling element 650 of the output waveguide 320.

The output waveguide 320 is an optical waveguide that outputs image light to an eye 620 of a user. In some embodiments, the output waveguide 320 is composed of one or more optically transparent materials (e.g. glass, plastic, etc.). The output waveguide 320 receives the image light 655 at one or more coupling elements 650, and guides the received input image light to one or more decoupling elements 660. In some embodiments, the coupling element 650 couples the image light 655 from the source assembly 610 into the output waveguide 320. The coupling element 650 may be, e.g., a diffraction grating, a holographic grating, some other element that couples the image light 655 into the output waveguide 320, or some combination thereof. For example, in embodiments where the coupling element 650 is a diffraction grating, the pitch of the diffraction grating is chosen such that total internal reflection occurs, and the image light 655 propagates internally toward the decoupling element 660. For example, the pitch of the diffraction grating may be in the range of 300 nm to 600 nm. The manufacturing system 100 performs a tunable shrinkage process on the coupling element 650 to adjust the refractive index as described above in conjunction with FIGS. 1-4B.

The decoupling element 660 decouples the total internally reflected image light from the output waveguide 320. The decoupling element 660 may be, e.g., a diffraction grating, a holographic grating, some other element that decouples image light out of the output waveguide 320, or some combination thereof. For example, in embodiments where the decoupling element 660 is a diffraction grating, the pitch of the diffraction grating is chosen to cause incident image light to exit the output waveguide 320. An orientation and position of the image light exiting from the output waveguide 320 is controlled by changing an orientation and position of the image light 655 entering the coupling element 650. For example, the pitch of the diffraction grating may be in the range of 300 nm to 600 nm. The manufacturing system 100 performs the tunable shrinkage process on the decoupling element 660 to adjust the refractive index as described above in conjunction with FIGS. 1-4B.

Additional Configuration Information

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the invention may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A method comprising:
    performing a micromolding of a resist formed on a substrate to create a pre-processed grating including a plurality of grating elements at a first slant angle relative to the substrate by transferring a specific pattern on the resist based on an application of a mechanical force from a mold held above the resist;
    performing a tunable shrinkage of the plurality of grating elements based on a physical removal of a portion of the pre-processed grating to create an intermediate grating at a second slant angle relative to the substrate different from the first slant angle;
    adjusting a refractive index of the intermediate grating based on a chemical cross-linking reaction of the resist to create a final grating with a target slant angle relative to the substrate different from the first and second slant angles; and
    modifying a refractive index of the final grating to generate a modified final grating by adding a plurality of functional materials with high refractive indices into the final grating.

2. The method of claim 1, further comprising:
    performing a post-processing of the plurality of grating elements to create the final grating by further adjusting at least one of a height and a volume of the intermediate grating.

3. The method of claim 1, wherein the target slant angle is in the range of 0 to 85 degrees.

4. The method of claim 1, wherein the target slant angle is larger than the first slant angle.

5. The method of claim 1, wherein the tunable shrinkage of the plurality of grating elements is further based on another chemical cross-linking reaction of the resist.

6. The method of claim 5, wherein the other chemical cross-linking reaction of the resist includes at least one of: a partial cross-linking reaction, an orthogonal cross-linking reaction, or some combination thereof.

7. The method of claim 1, wherein performing the tunable shrinkage of the plurality of grating elements further comprises:
    performing a first shrinkage along a first dimension with respect to a first surface of the substrate; and
    performing a second shrinkage along a second dimension with respect to the first surface of the substrate, the second dimension different than the first dimension.

8. The method of claim 1, wherein the intermediate grating is associated with a height of at most 2 microns, a duty cycle ranging from 0.1 to 0.9, and a pitch ranging from 0.25 to 1.5 microns.

9. The method of claim 1, wherein the intermediate grating undergoes a surface reaction based on an illumination with a collimated beam of light oriented at one or more slant angles different than the first slant angle relative to the substrate.

10. The method of claim 9, wherein the illumination with the collimated beam of light bends the plurality of grating elements to the target slant angle.

11. A method comprising:
    performing a micromolding of a resist formed on a substrate to create a pre-processed grating including a plurality of grating elements at a first slant angle relative to the substrate by transferring a specific pattern on the resist based on an application of a mechanical force from a mold held above the resist;
    performing a tunable shrinkage of the plurality of grating elements based on a physical removal of a portion of the pre-processed grating to create an intermediate grating at a second slant angle relative to the substrate different from the first slant angle;
    adjusting a refractive index of the intermediate grating based on a physical removal of a portion of the resist to create a final grating with a target slant angle relative to the substrate different from the first and second slant angles; and
    modifying a refractive index of the final grating to generate a modified final grating by adding a plurality of functional materials with high refractive indices into the final grating.

12. The method of claim 11, wherein the tunable shrinkage is further based on physically removing a plurality of moieties from the resist by heating the resist to a target temperature.

* * * * *